(12) United States Patent
Chang et al.

(10) Patent No.: US 7,800,731 B2
(45) Date of Patent: Sep. 21, 2010

(54) METHOD AND APPARATUS FOR REMOVING PARTICLES IN IMMERSION LITHOGRAPHY

(75) Inventors: Hsin Chang, Hsinchu (TW); Tzung-Chi Fu, Miaoli (TW); Tsai-Sheng Gau, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 577 days.

(21) Appl. No.: 11/556,550

(22) Filed: Nov. 3, 2006

(65) Prior Publication Data

US 2008/0106709 A1     May 8, 2008

(51) Int. Cl.
*G03B 27/42* (2006.01)
*G03B 27/52* (2006.01)
(52) U.S. Cl. .......................................... 355/53; 355/30
(58) Field of Classification Search .............. 355/67–71, 355/30, 53; 378/34, 35; 250/492.2, 492.22; 430/30

See application file for complete search history.

(56) References Cited

U.S. PATENT DOCUMENTS

| 6,936,151 | B1 * | 8/2005 | Lock et al. .................. 204/547 |
| 7,050,146 | B2 * | 5/2006 | Duineveld et al. ............ 355/30 |
| 2004/0075895 | A1 | 4/2004 | Lin |
| 2005/0225734 | A1 * | 10/2005 | De Smit et al. ............... 355/30 |
| 2005/0253090 | A1 | 11/2005 | Gau et al. |
| 2006/0216650 | A1 * | 9/2006 | Harayama ................... 430/311 |

\* cited by examiner

*Primary Examiner*—Hung Henry Nguyen
(74) *Attorney, Agent, or Firm*—Haynes and Boone, LLP

(57) ABSTRACT

A method and system involve supplying an immersion fluid to a space between an imaging lens and a substrate to be patterned, generating an electric field in the immersion fluid within the space so that the electric field urges particles away from a surface of the substrate, removing the immersion fluid along with the particles from the space, and thereafter supplying immersion fluid to the space and performing a lithographic exposing process on the surface of the substrate.

20 Claims, 7 Drawing Sheets

METHOD AND APPARATUS FOR REMOVING PARTICLES IN IMMERSION LITHOGRAPHY

BACKGROUND

The present disclosure relates generally to immersion lithography and, more particularly, to use of immersion lithography in the manufacture of semiconductor integrated circuits.

Immersion lithography typically involves exposing a coated resist to a pattern through de-ionized water (DIW) disposed in the space between a project lens and the resist layer for higher resolution. Current immersion lithography processes may include various processing steps such as resist coating, pre-baking, immersion exposing, post-exposure baking, developing, and hard baking. However, the current immersion lithography processes experience various contaminations and particles from wafers and components of the lithography system, resulting in pattern defects, pattern distortion, and pattern loss. What is needed is a simple and cost-effective method for collecting and removing contaminants and particles in immersion lithography.

BRIEF DESCRIPTION OF THE DRAWINGS

Aspects of the present disclosure are best understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

DETAILED DESCRIPTION

Figure 1:
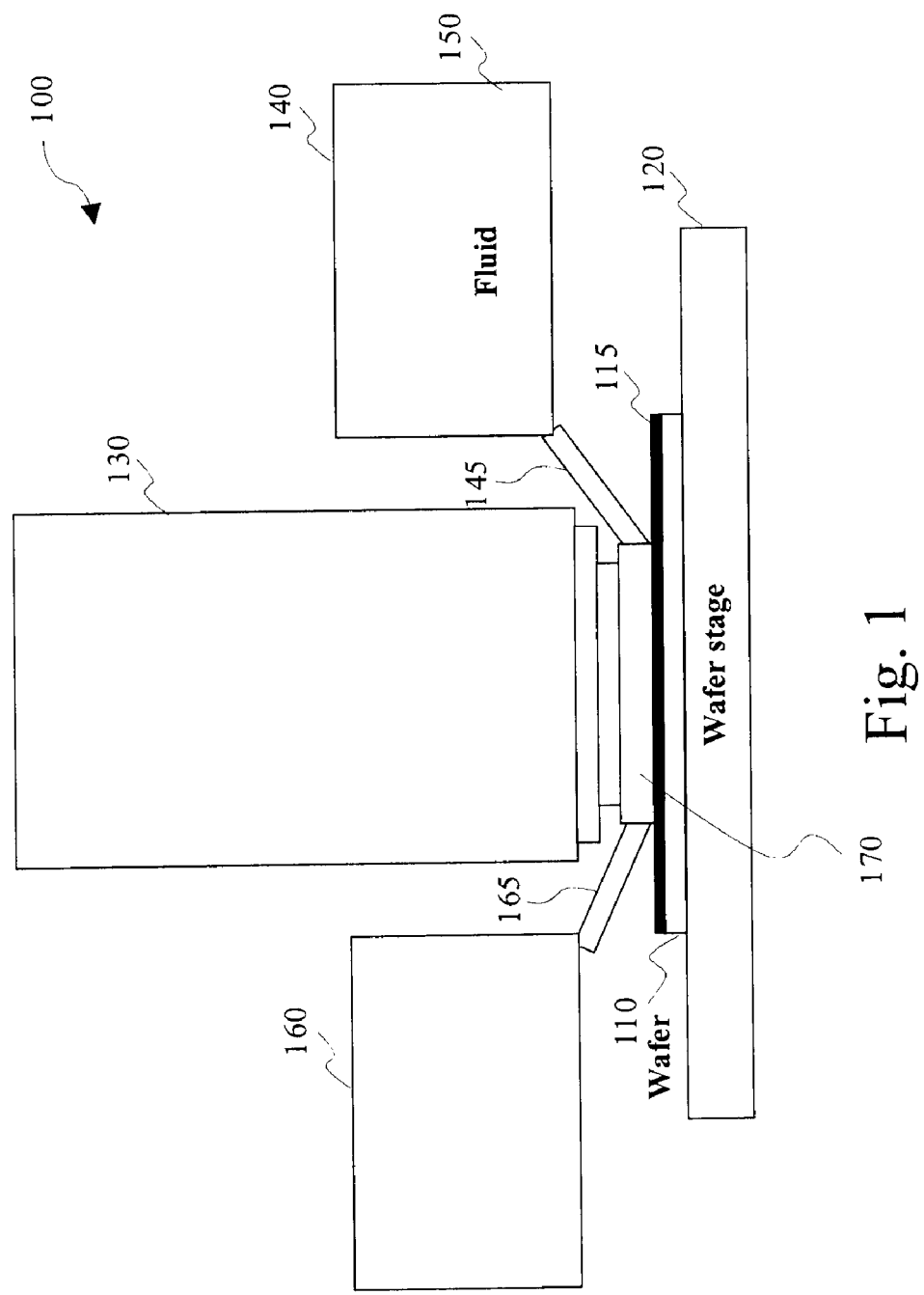
FIG. 1 is a schematic view of an existing immersion lithography system.

For the purpose of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, which does not by itself indicate a requirement that features of one embodiment apply to another embodiment, even if they share the same reference number.

Referring to FIG. 1, illustrated is a schematic view of an existing immersion lithography system 100 in which a substrate 110 is undergoing immersion lithography processing. The substrate 110 is a semiconductor wafer having an elementary semiconductor, a compound semiconductor, an alloy semiconductor, or combinations thereof. The substrate 110 includes one or more material layers such as poly-silicon, metal, and/or dielectric, to be patterned. Furthermore, the substrate 110 includes a photosensitive layer 115 formed thereon. The photosensitive layer 115 is a positive photoresist (resist) layer that is responsive to an exposure process for creating patterns. However, the photosensitive layer 115 may alternatively be a negative photoresist or other suitable materials.

The immersion lithography system 100 includes a substrate stage 120 to support and hold the substrate 110. The substrate stage 120 is operable to secure and move the substrate 110. For example, the stage 120 is designed to be capable of translational and/or rotational displacement for substrate 110 alignment, stepping, and scanning. The stage 120 provides movement relative to a imaging system, radiation source, and/or photomask of the immersion lithography system 100, as discussed below.

The immersion lithography system 100 includes an imaging system 130. The substrate 110 is positioned on the substrate stage 120 under the imaging system 130. The imaging system 130 further includes or is integral to an illumination system (e.g., a condenser) which may have a single lens or multiple lenses and/or other lens components. For example, the illumination system includes microlens arrays, shadow masks, and/or other structures. Furthermore, the imaging system 130 includes an objective lens which is not separately illustrated, and which has a single lens element or a plurality of lens elements. Each lens element includes a transparent substrate and further includes a plurality of coating layers. The transparent substrate is made of fused silica ($SiO_2$). However, the transparent substrate may alternatively be calcium-fluoride ($CaF_2$), lithium fluoride (LiF), barium fluoride ($BaF_2$), or other suitable materials. The materials used for each lens element are chosen based on the wavelength of light used in the lithography process, to minimize absorption and scattering.

The immersion lithography system 100 includes an immersion fluid retaining module 140 for holding an immersion fluid 150 such as ultra pure water (UPW), de-ionized water (DIW), or other suitable fluid. The system 100 also includes an immersion fluid collecting module 160 for receiving the immersion fluid 150. The immersion fluid retaining module 140 and collecting module 160 are positioned proximate (such as around) the imaging system 130. The immersion fluid 150 flows through an inlet 145, fills a space 170 between the substrate 110 and the imaging system 130, and flows out from the space through an outlet 165 into the immersion fluid collecting module 160. It is understood that the number of inlets 145 and outlets 165 can vary and the flow rate of the immersion fluid 150 to and from the space 170 can vary, depending on the type of immersion lithography system that is used.

The imaging system 130, immersion fluid retaining module 140, and immersion fluid collecting module 160 make up an immersion head.

The immersion lithography system 100 further includes a radiation source (not shown) for providing radiation energy for patterning the photosensitive layer 115 during an immersion lithography patterning process. The radiation source is a suitable ultraviolet (UV) light source. For the sake of example, the radiation source is one of a mercury lamp having a wavelength of 436 nm (G-line) or 365 nm (I-line); a krypton fluoride (KrF) excimer laser with wavelength of 248 nm; an argon fluoride (ArF) excimer laser with a wavelength of 193 nm; a fluoride ($F_2$) excimer laser with a wavelength of 157 nm; or other light sources having a desired wavelength (e.g., below approximately 100 nm).

A photomask (also referred to as a mask or a reticle) is introduced between the imaging system 130 and the photosensitive layer 115 during the immersion lithography process. The mask includes a transparent substrate and a patterned absorption layer. The transparent substrate includes fused silica ($SiO_2$) that is relatively free of defects, such as borosilicate glass and soda-lime glass. However, the transparent substrate may alternatively include calcium fluoride and/or other suitable materials. The patterned absorption layer is formed using a plurality of processes and a plurality of materials, such as depositing a metal film made with chromium (Cr) and iron oxide, or an inorganic film made with MoSi, ZrSiO, SiN, and/or TiN. A light beam is partially or completely blocked when it impinges on the absorption layer. The absorption layer is patterned to have one or more openings through which the light beam may travel without being absorbed by the absorption layer.

Figure 2:
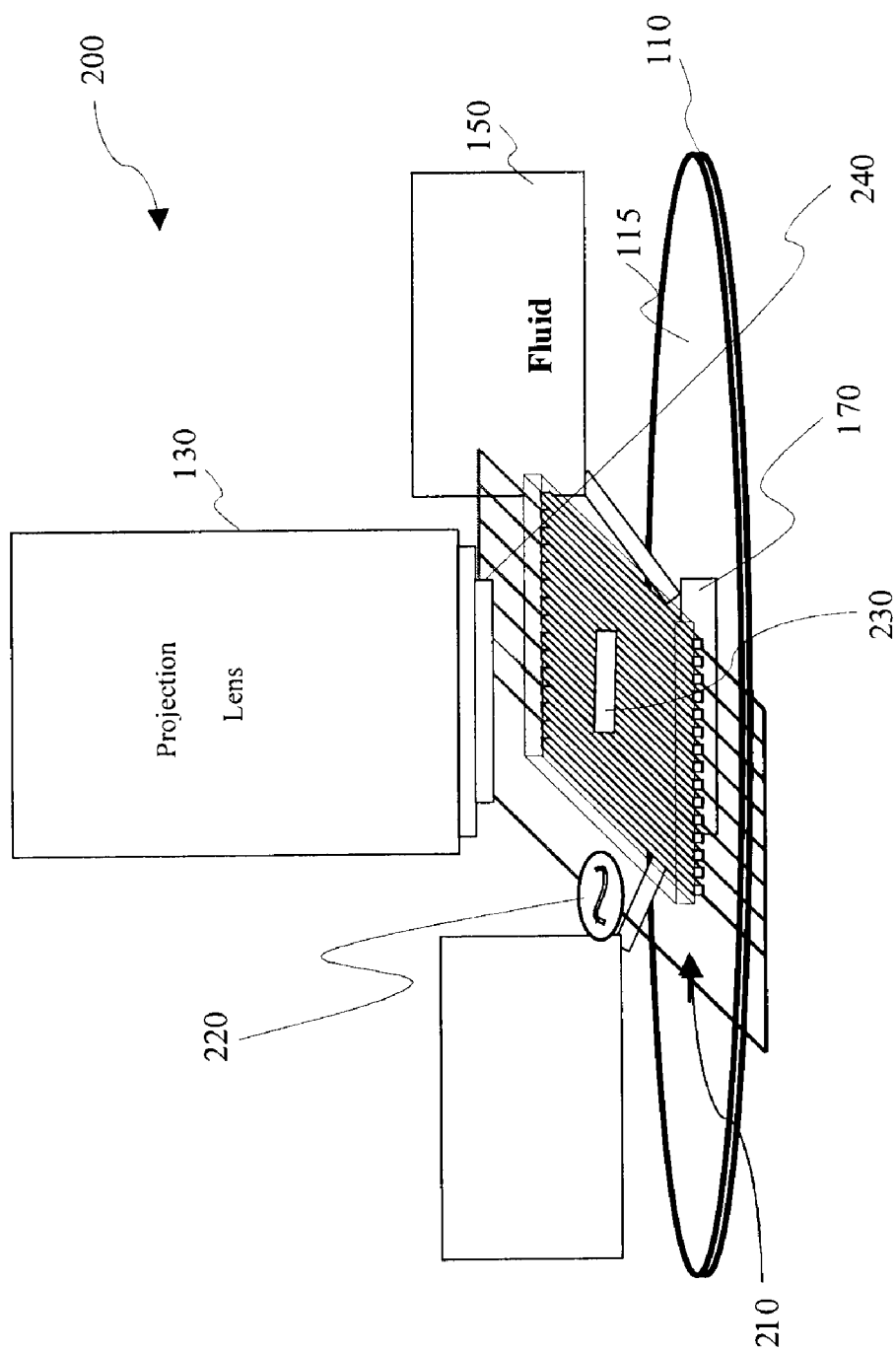
FIG. 2 is a semi-exploded, schematic view of an embodiment of an immersion lithography system according to the present disclosure.

Now referring to FIG. 2, illustrated is a semi-exploded, schematic view of an embodiment of an immersion lithography system 200 of the present disclosure. The system of FIG. 2 is very similar to the system of FIG. 1 except for some differences discussed below. For simplicity and clarity, like components in FIGS. 1 and 2 are numbered the same. The system 200 includes an array of electrodes 210 for generating a spatially non-uniform electric field in the immersion fluid 150 in the space 170 between the substrate 110 and the imaging system 130. The system 200 also includes a power supply 220 for providing a voltage potential to the array of electrodes 210. The array of electrodes 210 includes an opening 230 therethrough which is aligned with the imaging system 130, so that radiation energy passes through the opening when patterning the photosensitive layer 115 during an immersion lithography process.

The power supply 220 is located remotely or as part of the lithography system 200. The voltage potential includes a DC or AC voltage potential that is applied to the array of electrodes 210. The electrodes of the array 210 are elongate, spaced, parallel, co-planar strips, and each electrode in the array has a rectangular shape. In this configuration, the array of electrodes 210 is easily integrated within the immersion hood of the lithography system 200. However, the array of electrodes 210 may be of any shape and size, depending on the desired effect of the generated electric field. The array of electrodes 210 is housed in a structure 240 which is attached to the imaging system 130. During an immersion lithography process, the structure 240 is positioned in close proximity to or in contact with the immersion fluid 150 within the space 170. Accordingly, the electric field is generated inside the immersion fluid 150.

Alternatively, the non-uniform electric field may be generated in an electrodeless manner (without the array of electrodes). More specifically, the substrate 110 may be charged by an electron-beam bombardment process. Alternatively, the substrate 110 may already be charged due to prior processing steps that naturally generate electric charge such as ion bombardment. To generate the non-uniform electric field in space, a plurality of grounded structures could be located at various locations around the substrate 110. It is understood that the size and shape of the plurality of grounded structures could vary, depending on the electric field that is desired. Accordingly, a potential difference between the charged substrate 110 and the grounded structures would generate the non-uniform electric field on the surface of the substrate and thus, generate the non-uniform electric field inside the immersion fluid 150 provided in the space 170 between the substrate 110 and the imaging system 130.

Alternatively, the non-uniform electric field may be generated using optical images (or virtual electrodes) projected on a photoconductive surface. More specifically, a photoconductive plate may be housed in the structure 240 which is attached to the imaging system 130. The photoconductive plate may include an indium tin oxide-coated glass or other suitable photoconductive substrates. It is understood that the plate may optionally include other layers such as doped and/or undoped hydrogenated amorphous silicon, silicon nitride, silicon oxide, or other suitable materials. The photoconductive plate may be biased by the power supply 230. A light source, for example a light-emitting diode, projects an optical image of virtual electrodes on the photoconductive plate. Various mirrors and/or lens may be used to project the optical image on the photoconductive plate. When the projected light illuminates the photoconductive plate, the virtual electrodes (illuminated areas) become energized and generate a non-uniform electric field. During an immersion lithography process, the photoconductive plate housed in the structure 240 is positioned in close proximity to or in contact with the immersion fluid 150 within the space 170. Accordingly, the non-uniform electric field is generated inside the immersion fluid 150.

Figure 3A:
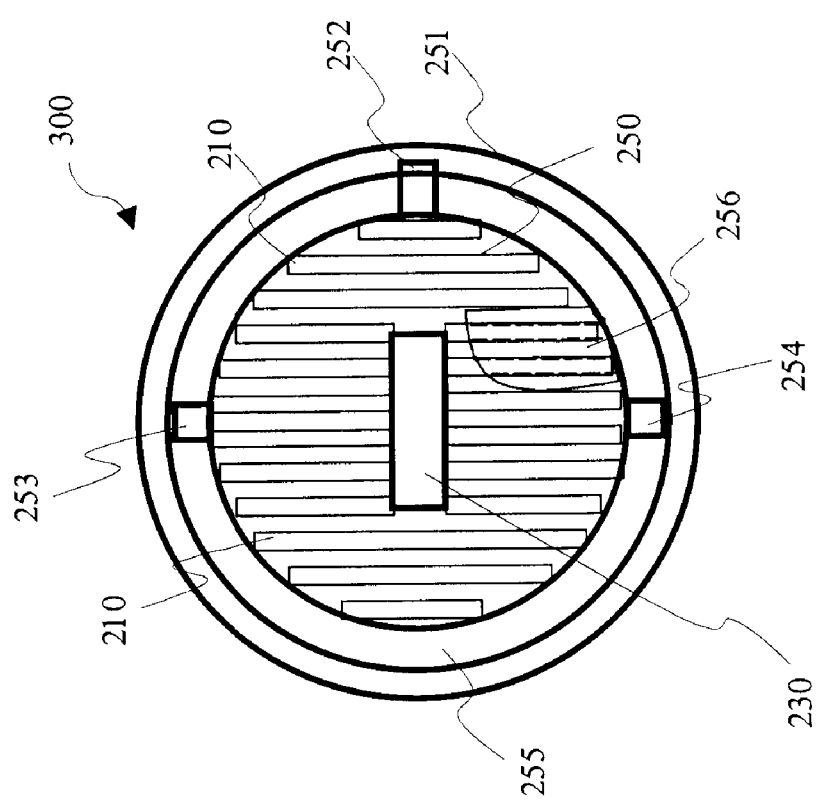
FIG. 3A is a top view of an embodiment of an array of electrodes used in the immersion lithography system of FIG. 2.

Now referring to FIG. 3A, illustrated is a fragmentary top view structure 300 that includes the array of electrodes 210 used in the immersion lithography system 200 of FIG. 2. For simplicity and clarity, like components in FIGS. 2 and 3A are numbered the same. In FIG. 3A, the structure 300 includes the array of electrodes 210 formed on a non-conductive electrode plate 250 with the opening 230 through the array and the plate. The electrode plate 250 is connected to an outer ring 251 by linking bars 252, 253, 254. The electrode plate 250 and outer ring 251 are made from an insulating material such as silicon dioxide. An open area 255 defined by the electrode plate 250 and outer ring 251 allows the immersion fluid 150 to flow in the space 170 between the substrate 110 and the imaging system 130 during operation (as shown in FIG. 1). The array 210 includes a plurality of spaced and rectangular-shaped electrode strips that are positioned in the same plane and are parallel with each other. Each electrode is made of a conductive material such as copper. However, the electrodes may alternatively be aluminum or any other suitable material. The electrodes in the array 210 are covered with a dielectric layer 256 to prevent direct contact with the immersion fluid. Part of the dielectric layer 256 is broken away, for clarity. The dielectric layer 256 covers all the electrodes of the array 210. The array 210 has a small pitch to provide more coverage and produce a more dense electric field gradient. The structure 300 is affixed to the imaging system 130 of FIG. 2 by not-illustrated screws. However, the structure 300 may alternatively be affixed to the imaging system 130 by other fastening structure such as a quick release coupling mechanism so that the structure 300 is easily installed in and removed from the immersion lithography system 200 without any adverse impact to the operation of the system, and to facilitate easy maintenance for cleaning the array of electrodes 210.

Figure 3B:
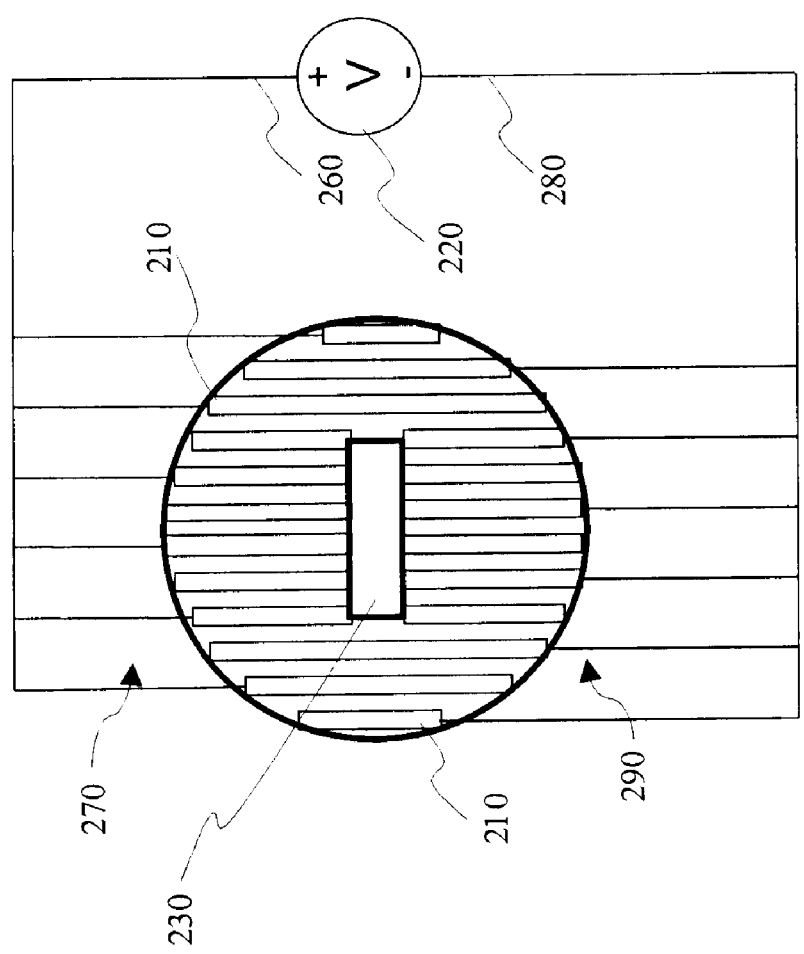
FIG. 3B is a diagrammatic top view illustrating power connections to the array of electrodes of FIG. 3A.

Now referring also to FIG. 3B, illustrated are the power connections to the array of electrodes of FIG. 3A. The power supply 220 supplies a voltage potential to the array of electrodes 210. More specifically, one side 260 (e.g., positive) of the power supply 220 is coupled to a set of alternate electrode strips 270 while the opposite side 280 (e.g., negative/common) of the power supply is coupled to another set of alternate electrode strips 290. It is understood that all the electrodes are coupled to the power supply 220 in this alternating configuration even though the opening 230 is located through the array 210. That is, where an electrode is divided into two spaced sections by the opening 230, those two sections are both electrically coupled to each other or to the same side of the power supply 220. Each electrode of the array 210 is of an opposite polarity with respect to the electrode located next to it. During operation, a spatially non-uniform electric field is generated by the array 210 in which the magnitude of the electric field varies depending on a position measured from the array.

Figure 4:
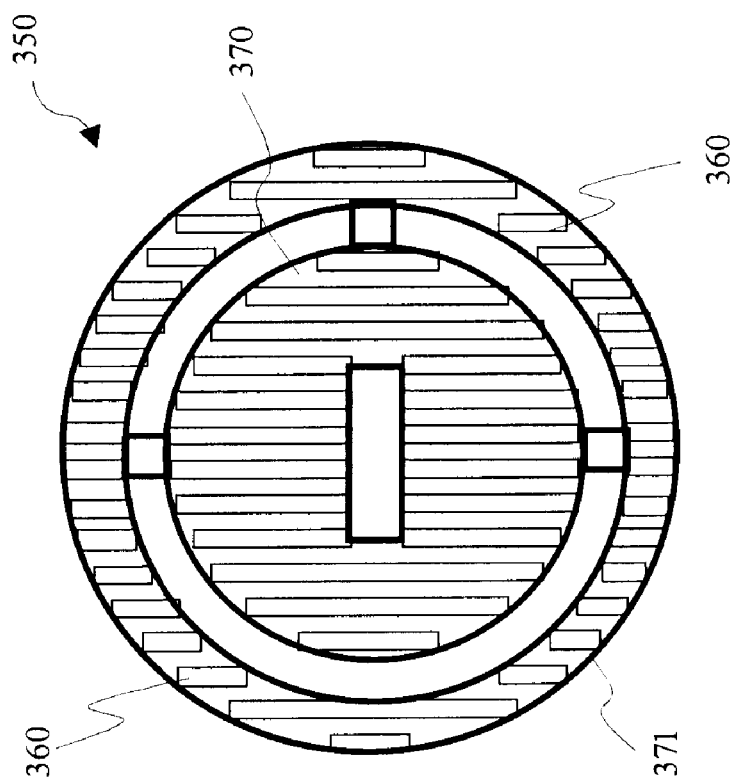
FIG. 4 is a top view of an array of electrodes that is an alternative embodiment of the array of electrodes of FIG. 3A.

Referring now to FIG. 4, illustrated is a structure 350 having an array of electrodes 360 that is an alternative embodiment of the array of electrodes 210 of FIG. 3A. In FIG. 4, the array of electrodes 360 are formed on an electrode plate 370 as well as an outer ring 371. Accordingly, the array of electrodes 360 is configured to generate an electric field that covers most of the immersion fluid 150 in the space 170 between the substrate 110 and the imaging system 130 (FIG. 2). The electrodes of the array 360 are covered with a not-illustrated dielectric layer and are coupled to a power supply in the same manner as described for FIG. 3B. It is understood that the structures 300 and 350 are described for the sake of example, and are not intended to limit the present disclosure from that recited in the claims.

Figure 5:
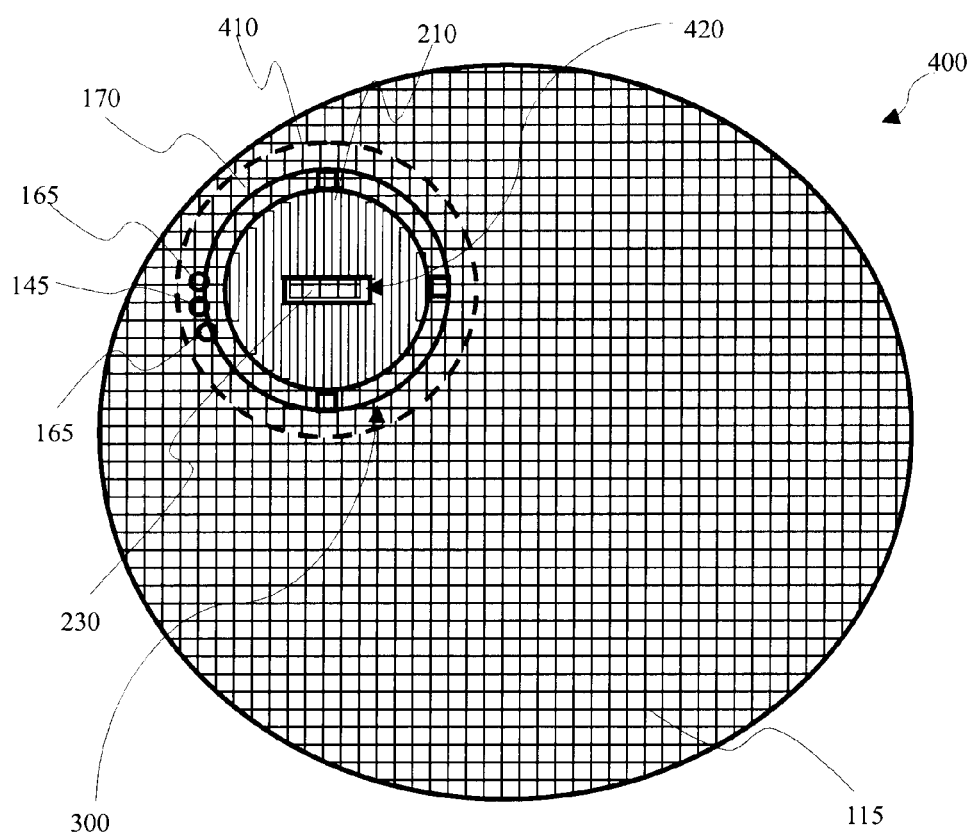
FIG. 5 is an fragmentary diagrammatic top view of an immersion lithography exposure using the array of electrodes of FIG. 3A.

Now referring also to FIG. 5, illustrated is a fragmentary diagrammatic top view of an immersion lithography exposure 400 that utilizes the structure 300 housing the array of electrodes 210 of FIG. 3A. For simplicity and clarity, FIG. 5 is described below with reference to FIGS. 1-3. The substrate 110 (FIG. 2) having a photosensitive layer 115 formed thereon undergoes an immersion lithography exposure 400 to form a pattern. The immersion fluid 150 flows through an inlet 145 into the space 170 between the substrate 110 and the structure 300 housing the array of electrodes 210. The array structure 300 is attached to the imaging system 130. Moreover, the immersion fluid 150 flows out from the space through the outlet 165 and into the immersion fluid collecting module 160. Thus, the immersion fluid 150 flows to and from the space 170 at a substantially constant rate during operation.

The immersion fluid 150 flowing onto the substrate 110 has a boundary 410. The boundary 410 extends around a portion 420 of the photosensitive layer 115 that will be patterned. The portion 420 is the portion currently aligned with the opening 230 within the array of electrodes 210. The radiation energy from the lithography system 200 passes through the opening 230 and exposes the portion 420 of the photosensitive layer 115 to form a pattern.

Figure 6:
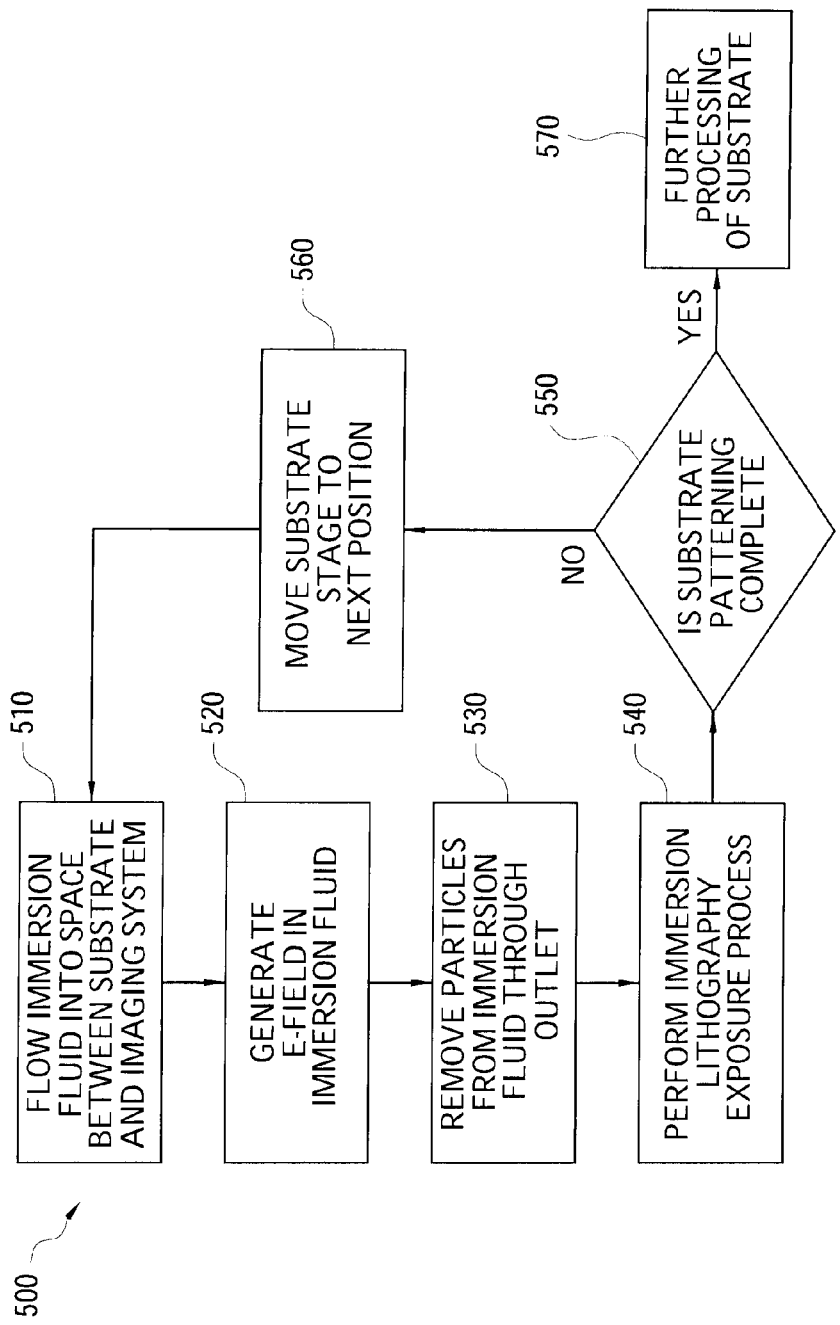
FIG. 6 is a flowchart of an embodiment of a method implemented by the immersion lithography system of FIG. 2.

Now referring also to FIG. 6, illustrated is a flowchart of a method 500 implemented by the immersion lithography system 200 of FIG. 2. The method 500 is described below with reference to FIGS. 1-5. The method 500 is implemented during an immersion lithography patterning process, in which the immersion fluid 150 helps to form a pattern on the photosensitive layer 115 of the substrate 110. The substrate 110 is held in place by the substrate stage 120 and is moved in close proximity underneath the immersion hood of the system 200.

The method 500 begins with block 510 in which the immersion fluid 150 flows into the space 170 between the substrate 110 and the imaging system 130. The immersion fluid 150 flows from the immersion fluid retaining module 140 via the inlet 145. The system 200 utilizes control signals and valves (not shown) to regulate the flow of immersion fluid 150 into the space 170.

The method 500 proceeds with block 520 in which a spatially non-uniform electric field is generated within the immersion fluid 150 in the space 170. The electric field is generated by applying an AC or DC voltage to the array of electrodes 210. Alternatively, the electric field may be generated by charging the substrate 110 or illuminating the photoconductive plate (virtual electrodes) as discussed previously. There usually are contaminants and particles on a surface of the substrate 110 that may cause defects when patterning the photosensitive layer 115. The spatially non-uniform electric field is used to force or urge the contaminants and particles away from the surface of the substrate 110 and into the immersion fluid 150 so that they are removed by the flow of immersion fluid out from the space 170. The mechanism by which the spatially non-uniform electric field manipulates the particles is explained below.

Dielectrophoresis (DEP) is a physical phenomenon in which a force is exerted on a particle when the particle is subjected to a non-uniform electric field. All particles (charged or uncharged) suspended in a medium experience dielectrophoretic activity in the presence of electric fields. Thus, DEP is applicable in all kinds of mediums and with respect to all kinds of particles. The particles move toward or away from regions of high electric field intensity depending on whether the induced dipole moment of the particles is greater or smaller than that of the medium. The time average DEP force induced by a non-uniform electric field on a particle suspended in a medium may be expressed as:

$$F_{DEP} = 2\pi R^3 \in_m Re(K(\omega)) \nabla [E_{rms}]^2$$

where R is the radius of the particle, $\in_m$ is permittivity of the medium, $E_{rms}$ is the root mean square value of the electric field, and $Re(K(\omega))$ is the real part of the Clausius-Mossotti Factor in which $\omega$ is the angular frequency of the electric field. The Clausius-Mossotti Factor is expressed as:

$$K(\omega) = (\in_p^* - \in_m^*)/(\in_p^* + 2\in_m^*)$$

where $\in_p^*$ and $\in_m^*$ represent the relative complex permittivity of the particle and the suspending medium respectively, defined as $\in^* = \in -i(\sigma/\omega)$ where $\sigma$ is the conductivity and i is the square root of minus one.

As shown by the equation above, the DEP force is dependent on the size of the particle. Furthermore, the DEP force on the particle has a positive or negative value depending on the sign of the Clausius-Mossotti Factor. When the DEP force is positive (also known as positive DEP), the particle is pulled toward a region where the electric field is greatest (high-intensity region). When the DEP force is negative (also known as negative DEP), the particle is displaced away from a region where the electric field is greatest. Thus, by varying the frequency and magnitude of the applied electric field, positive DEP may be used to attract particles toward a region, while negative DEP may be used to release those same particles toward another region. Accordingly, the DEP force can be an efficient mechanism to transport particles along a specified path.

Continuing with block 520, the power supply 220 is varied with respect to its magnitude and frequency to achieve the desired effect of the electric field. The voltage potential depends on the size and chemical make-up of the particles in the immersion fluid 150. Thus, a voltage potential is selected to produce a positive DEP force on the particles so that the particles are attracted to a region where the electric field is the greatest (high-intensity region). Accordingly, the particles in the immersion fluid 150 in the space 170 will be forced away from the surface of the substrate 110 and attracted towards the array of electrodes 210.

The method 500 proceeds with block 530 in which the particles are removed by the flow of immersion fluid 150 out from the space 170. As previously discussed, the immersion fluid 150 flows to and from the space 170 at a substantially constant flow rate. Thus, the flow of the immersion fluid 150 will remove the particles through the outlet 165 and into the immersion fluid collecting module 160 before the particles reach the array of electrodes 210 on the electrode plate 250. In the case where the particles reach the electrode plate 250, the voltage potential can be changed to induce a negative DEP force on the particles during a substrate exchange. As previously discussed, particles are forced away from a high-intensity region when they experience a negative DEP force. Accordingly, the particles are urged away from the array 210 and can then be carried out by the flow of immersion fluid 150 through the outlet 165. During a substrate exchange, the immersion hood is completely covered by a closing disk structure of a known type (not shown). However, the immersion fluid 150 still flows to and from the space that is between the closing disk structure and the immersion hood. Thus, the particles are removed from the array of electrodes 210 and electrode plate 250 before a new substrate is placed on the substrate stage 120 for patterning.

The method 500 proceeds with block 540 in which the immersion lithography system 200 performs an immersion lithography exposure process (shown in FIG. 5) to the portion 420 of the photosensitive layer 115 that is aligned with the opening 230. Because of the positive DEP force on the particles and the constant flow of immersion fluid 150 to and from the space 170, there will be no more particles within the portion 420 of the photosensitive layer 115. Therefore, exposing the portion 420 of the photosensitive layer 115 with radiation energy will form a pattern free of any defects.

The method 500 proceeds with block 550 in which a determination is made as to whether patterning the photosensitive layer 115 of the substrate 110 is complete. If patterning of the substrate 110 is not complete, the method 500 proceeds with block 560 in which the substrate 110 is moved to a next position via the substrate stage 120 for further patterning. The method 500 repeats blocks 510 thru 540 to complete patterning of the entire photosensitive layer 115. When patterning of the substrate 110 is complete, the method 500 proceeds with block 570 in which the substrate 110 undergoes further processing such as a post-exposure baking, developing, cleaning, etching, and/or other processes known in the art. It is understood that the method 500 can be implemented in a similar manner when the electric field is generated by charging the substrate 110 or by illuminating the photoconductive plate (virtual electrodes).

Although embodiments of the present disclosure have been described in detail, those skilled in the art should understand that they can make various changes, substitutions and alterations without departing from the spirit and scope of the present disclosure. It is understood that various different combinations of the above listed processing steps can be used in combination or in parallel. Also, features illustrated and discussed above with respect to some embodiments can be combined with features illustrated and discussed above with respect to other embodiments. Accordingly, all such modifications are intended to be included within the scope of this disclosure.

Thus, the present disclosure provides a method for use in immersion lithography. The method comprises supplying an immersion fluid to a space between an imaging lens and a substrate to be patterned, generating an electric field in the immersion fluid within the space, wherein the electric field urges particles away from a surface of the substrate, and thereafter supplying immersion fluid to the space and performing a lithographic exposing process on the surface of the substrate. The generating includes configuring the electric field to include a spatially non-uniform electric field.

In some embodiments, generating the electric field includes applying a DC or AC voltage to an array of electrodes in a region of the space. In some embodiments, generating the electric field illuminating a photoconductive plate disposed in a region of the space. In some other embodiments, generating the electric field includes charging the substrate. In still other embodiments, the supplying includes supplying the immersion fluid to the space at a substantially constant flow rate and the removing includes drawing the immersion fluid from the space at the substantially constant flow rate.

The present disclosure also provides an immersion lithography system. The system comprises an imaging system, a substrate stage positioned beneath the imaging system, a fluid flowing portion that supplies an immersion fluid to and from a space between the imaging system and the substrate stage, and a field generator portion that generates an electric field in the immersion fluid within the space. The electric field is configured to induce particles to move toward the field generating portion so that the particles are removed by the flow of immersion fluid from the space.

In some embodiments, the field generating portion includes a housing affixed to the imaging system and an array of electrodes formed within the housing for generating the electric field. In some embodiments, the electrodes of the array are co-planar. Each electrode in the array is approximately rectangular. In still other embodiments, the fluid flowing portion includes a fluid retaining module configured to supply the immersion fluid in the space, and a fluid collecting module configured to remove the immersion fluid from the space. In other embodiments, the field generating portion includes a power supply for providing a voltage potential to the array of electrodes. In some embodiments, the voltage potential is an AC or DC voltage potential. In some embodiments, the field generating region includes a photoconductive plate disposed within a housing affixed to the imaging system. The photoconductive is illuminated to generate the electric field.

The present disclosure provides a method for use in immersion lithography. The method comprises providing a semiconductor substrate with a photosensitive layer formed thereon, supplying an immersion fluid to and from a space between an imaging system and the semiconductor substrate, generating an electric field within the immersion fluid to urge particles away from the substrate so that the particles are removed by the flowing of the immersion fluid from the space, and illuminating the photosensitive layer through the imaging system.

In some embodiments, generating the electric field includes configuring the electric field to include a non-uniform electric field. In other embodiments, generating includes applying a voltage potential to a plurality of electrodes disposed in a region of the space. In other embodiments, generating includes charging the substrate. In other embodiments, generating includes illuminating a photoconductive plate disposed in a region of the space. In other embodiments, generating includes configuring the non-uniform electric field to induce a positive dielectrophoretic force on the particles.

Several different advantages exist from these and other embodiments. In addition to providing an in-situ particle removal method for immersion lithography scanners, the method applies to all kind of immersion fluids and to all kinds of contaminants or particles. Many of the steps do not require a separate chamber, and many of the steps are very low cost in terms of processing time, materials, and/or throughput. The array of electrodes can be easily integrated into lithography scanners with no impact on the operation of the scanners and allows for easy maintenance of the electrodes.

What is claimed is:

1. A method comprising:
    supplying an immersion fluid to a space between an imaging lens and a substrate to be patterned;
    generating an electric field in the immersion fluid within the space, wherein the electric field urges particles away from a surface of the substrate;
    removing the immersion fluid along with particles from the space; and
    thereafter supplying immersion fluid to the space and performing a lithographic exposing process on the surface of the substrate;
    wherein the electric field is generated by a plurality of coplanar electrodes that includes at least three electrodes that are interleaved such that adjacent electrodes are at different potentials and surround an exposure field of the imaging lens, wherein the exposure field is absent the plurality of electrodes.

2. The method of claim 1, wherein the generating includes configuring the electric field to include a spatially non-uniform electric field.

3. The method of claim 2, wherein the generating includes applying a DC or AC voltage to the at least of the three electrodes disposed in a region of the space.

4. The method of claim 1, wherein the supplying includes supplying the immersion fluid to the space at a substantially constant flow rate and wherein the removing includes removing the immersion fluid from the space at the substantially constant flow rate.

5. An immersion lithography system comprising:
    an imaging system;
    a substrate stage positioned beneath the imaging system;
    a fluid supply portion that causes an immersion fluid to flow to and from a space between the imaging system and the substrate stage; and
    a field generating portion that generates an electric field in the immersion fluid within the space, wherein the electric field is generated by a plurality of coplanar electrodes that includes at least three electrodes that are interleaved such that adjacent electrodes are at different voltage potentials and surround an exposure field of the imaging system, wherein the exposure field is absent the plurality of electrodes;
    wherein the electric field is configured to induce particles to move toward the field generating portion so that particles are removed by the flow of immersion fluid from the space.

6. The system of claim 5, wherein the field generating portion is formed within a housing that is affixed to the imaging system.

7. The system of claim 5, wherein each electrode in the plurality of electrodes is approximately rectangular.

8. The system of claim 5, wherein the fluid supply portion includes:
    a fluid retaining module configured to supply the immersion fluid to the space; and
    a fluid collecting module configured to receive the immersion fluid removed from the space.

9. The system of claim 5, wherein the field generating portion includes a power supply for providing a voltage potential to the at least three electrodes.

10. The system of claim 9, wherein the voltage potential includes an AC or DC voltage potential.

11. A method comprising:
    providing a semiconductor substrate with a photosensitive layer formed thereon;
    supplying an immersion fluid to and from a space between a imaging system and the semiconductor substrate;
    generating an electric field in the space to urge non-gaseous particles away from the substrate so that particles are removed by the flow of the immersion fluid from the space, wherein the electric field is generated by a plurality of coplanar electrodes that includes at least three electrodes that are interleaved such that adjacent electrodes are at different voltage potentials and surround an exposure field of the imaging system; and
    illuminating the photosensitive layer through the imaging system.

12. The method of claim 11, wherein the generating includes configuring the electric field to include a non-uniform electric field.

13. The method of claim 12, wherein the generating includes applying DC or AC voltage potential to the at least three electrodes disposed in a region of the space.

14. The method of claim 12, wherein the generating includes configuring the non-uniform electric field to induce a positive dielectrophoretic force on particles.

15. The method of claim 1, wherein the plurality of coplanar electrodes are parallel to the surface of the substrate.

16. The method of claim 15, wherein one of the plurality of coplanar electrodes is energized by a first potential and another of the plurality of electrodes is energized by a second potential having a polarity different from the first potential.

17. The system of claim 5, wherein the plurality of coplanar electrodes are parallel to each other.

18. The system of claim 17, wherein one of the plurality of coplanar electrodes is energized by a first potential and another of the plurality of electrodes is energized by a second potential having a polarity different from the first potential.

19. The method of claim 11, wherein the exposure field is absent the plurality of electrodes.

20. The method of claim 11, wherein at least one of the at least three electrodes is divided into two spaced sections by the exposure field and the two space sections have the same voltage potential.

* * * * *